(12) United States Patent
Siu

(10) Patent No.: US 10,849,212 B2
(45) Date of Patent: Nov. 24, 2020

(54) DEVICES AND SYSTEMS FOR CONTROLLING ELECTROSTATIC DISCHARGE ON ELECTRONIC DEVICES

(71) Applicant: PANASONIC AVIONICS CORPORATION, Lake Forest, CA (US)

(72) Inventor: Donald Siu, Santa Ana, CA (US)

(73) Assignee: PANASONIC AVIONICS CORPORATION, Lake Forest, CA (US)

( * ) Notice: Subject to any disclaimer, the term of this patent is extended or adjusted under 35 U.S.C. 154(b) by 283 days.

(21) Appl. No.: 15/980,458

(22) Filed: May 15, 2018

(65) Prior Publication Data

US 2019/0357340 A1  Nov. 21, 2019

(51) Int. Cl.
| | |
|---|---|
| H05F 3/02 | (2006.01) |
| H05F 3/04 | (2006.01) |
| H05K 1/09 | (2006.01) |
| H05K 1/02 | (2006.01) |
| H05K 1/18 | (2006.01) |
| B23P 19/04 | (2006.01) |

(52) U.S. Cl.
CPC .............. *H05F 3/02* (2013.01); *B23P 19/04* (2013.01); *H05F 3/04* (2013.01); *H05K 1/0296* (2013.01); *H05K 1/09* (2013.01); *H05K 1/182* (2013.01)

(58) Field of Classification Search
CPC .... H05F 3/02; H05F 3/04; H05K 1/09; H05K 1/0296; H05K 1/182; H05K 1/026; H05K 2201/10189; H05K 1/116; H05K 1/115; H05K 1/0259; H05K 1/144; H05K 2201/042; B23P 19/04

See application file for complete search history.

(56) References Cited

U.S. PATENT DOCUMENTS

| | | | |
|---|---|---|---|
| 2,427,460 A | 9/1947 | Johnson | |
| 4,456,800 A * | 6/1984 | Holland | ................... H01H 9/14 174/260 |
| 5,029,041 A | 7/1991 | Robinson et al. | |
| 5,686,697 A | 11/1997 | Miller et al. | |

(Continued)

FOREIGN PATENT DOCUMENTS

| | | |
|---|---|---|
| CN | 2747819 Y | 12/2005 |
| CN | 103140016 A | 11/2011 |
| CN | 103140016 | 6/2013 |

*Primary Examiner* — Kyle J Moody
(74) *Attorney, Agent, or Firm* — Perkins Coie LLP

(57) ABSTRACT

Devices and systems for controlling electrostatic discharge on electronic at the interface of mating electrical connectors. An electrostatic discharge (ESD) control device comprises a substrate and at least one connector pin hole. An outer edge of the substrate is also electrically conductive and configured to be electrically connected to a ground. Each the connector pin hole(s) is electrically conductive such that it electrically connects to a respective pin of one of the mating electrical connectors. For each of the connector pin hole(s), an electrically conductive trace is disposed in the substrate. Each of the traces has a pair of opposing sharp points in close proximity to each other and directed at each other. One of the sharp points is electrically connected to the electrically conductive connector pin hole, and the other sharp point is electrically connected to the electrically conductive outer edge of the substrate.

18 Claims, 3 Drawing Sheets

(56) References Cited

U.S. PATENT DOCUMENTS

| | | | |
|---|---|---|---|
| 5,998,731 A | 12/1999 | Takamura | |
| 6,407,895 B1 | 6/2002 | Capps | |
| 6,613,979 B1 | 9/2003 | Miller et al. | |
| 6,839,214 B2* | 1/2005 | Berberich | H01R 13/6625 |
| | | | 361/112 |
| 7,161,785 B2* | 1/2007 | Chawgo | H01T 4/06 |
| | | | 361/119 |
| 7,442,045 B1 | 10/2008 | Di Stefano | |
| 7,495,168 B2 | 2/2009 | Park | |
| 7,576,414 B2 | 8/2009 | Huang et al. | |
| 9,860,974 B2 | 1/2018 | Siu | |
| 2006/0002047 A1* | 1/2006 | Cheung | H01T 21/00 |
| | | | 361/118 |
| 2008/0158766 A1* | 7/2008 | Oyama | H05K 1/0259 |
| | | | 361/220 |
| 2009/0195946 A1 | 8/2009 | Kleveland | |
| 2017/0117702 A1 | 4/2017 | Siu | |

\* cited by examiner

| Minimum creepage distance in circuits other than primary AC circuits (mm) | | | | | | | | | |
|---|---|---|---|---|---|---|---|---|---|
| Working voltage | External [2] | | | Internal [3] | | | Layer thickness [4] [5] | | |
| Vp | F | B/S | R/D | F | B/S | R/D | F/B | S | R/D |
| 0 - 10 | 0.40 (0.10) [6] | | | 0.10 | | | | | Note 5 |
| 11 - 15 | 0.45 (0.14) [6] | | | 0.14 | | | | | |
| 16 - 30 | 0.53 (0.20) [6] | | | 0.20 | | | | | |
| 31 - 50 | 1.00 | | | 0.20 | | | | | |
| 51 - 150 | 1.40 | | Note 7 | 0.27 | | Note 7 | Note 5 | | |
| 151 - 250 | 2.50 | | | 0.56 | | | | | |
| 251 - 300 | 3.00 | | | 0.70 | | | | | 0.4 [8] |
| 301 - 500 | 4.80 | | | 1.25 | | | | | |
| >500V V=Vp-500 | 4.8 + (V x0.01) | | | 1.25 + (V x0.004) | | | | | |

F=functional insulation, B=basic insulation, S=supplementary insulation, D= double insulation, R=Reinforced insulation

DEVICES AND SYSTEMS FOR CONTROLLING ELECTROSTATIC DISCHARGE ON ELECTRONIC DEVICES

BACKGROUND

The field of the invention generally relates to controlling electrostatic discharge on electronic devices, and more particularly, to devices and systems for controlling electrostatic discharge on connectors of electronic devices.

Many electronic components, including semiconductor devices like microprocessors and integrated circuits, are susceptible to being permanently damaged by electrostatic discharge (ESD) which can subject nearby objects to very high electrical voltage and current. Electrostatic discharge (ESD) is the sudden flow of electricity between two electrically charged objects caused by contact, an electrical short, or dielectric breakdown (air discharge). A buildup of static electricity can be caused by tribocharging, by electrostatic induction, or other build-up of static electric charges on an object. Tribocharging is the build-up of static electric charges caused by friction between two materials. For instance, a human body can accumulate an electrostatic charge by walking on a rug, and rubber or plastic objects can build-up charges by rubbing them against a sweater or other types of fabric. There are two main types of ESD, "air discharge" and "contact discharge." An air discharge ESD occurs when the charged object contacts a differently charged object. A contact discharge ESD occurs when the charged object comes sufficiently close to a differently charged object causing a dielectric breakdown of the air which causes the air to temporarily become an electrical conductor. This is also called a spark-over.

If a static charge discharges (i.e., an ESD) to an electronic device, the large voltage and current can permanently damage electronic components of the device. For instance, the voltage of an ESD is typically significantly higher than the breakdown voltage of many semiconductor devices like microprocessors and integrated circuits. If the semiconductor device is subjected to voltage exceeding the breakdown voltage, the semiconductor device is often permanently damaged and rendered inoperable.

Accordingly, a number of protective devices have been previously disclosed to protect electronic devices from being damaged by ESD. As an example, transient voltage suppression diodes (TVS diodes) have been utilized in the design and manufacture of electronic devices to protect the components from being damaged by ESD. The TVS diodes typically serve as parallel protection elements which divert transient current away from protected components in the event of an ESD. However, there are many different types of TVS diodes with different specifications, and they must be designed into the circuit design of the electronic devices.

SUMMARY

The present invention is directed to an innovative ESD control device for controlling ESD at the interface of mating electrical connectors. In another feature, the ESD control device may also maintain galvanic isolation of the various circuits connected to the mating electrical connectors in order to meet galvanic isolation requirements. For example, a first electronic device may have a first electrical connector which connects to a mating second electrical connector for providing electric power to the first electronic device and/or transmitting electrical signals between the first electronic device and a second electronic device. In a more specific example, the first electronic device may be a tablet computer having a first electrical connector and the second electronic device may be a cradle or docking station for removably receiving and holding the tablet computer and for providing electric power to the tablet computer and transferring electrical signals between the docking station and tablet computer (e.g., a data networking connection).

Electrostatic charge may build-up at the first and second connectors, such as the pins, sockets, or other conductive contacts, of the first and second connectors, or through charge accumulated from connected or nearby objects. If the first and second electronic devices are not grounded, then the electronic device may also build-up electrostatic charge.

The present invention is directed to an ESD control device comprising an ESD control insert which is configured to be installed between the first and second connectors and which controls ESD of static charge built up on the first and second connectors. The ESD control insert controls ESD by discharging static charge built up on the first and second connectors to a ground, such as a chassis ground.

In one embodiment, the ESD control insert comprises a substrate which forms the main structure of the insert. For example, the substrate may comprise a printed circuit board substrate, such as any suitable insulating or dielectric substrate. The substrate may be rigid, semi-rigid or flexible. The substrate is typically a flat plate having a first side, an outer perimeter, and one or more connector pin holes. The substrate may be shaped to extend over all of the conductive connections of the first and second connectors. The substrate may also be shaped to fit within a recess or cavity proximate the first and/or second connectors in a particular use of the ESD control insert. The connector pin holes are sized and arranged to allow the connector pins of the first connector and/or second connectors to be received in the connector pin holes.

At least a portion of the outer perimeter of the substrate is electrically conductive. For instance, the outer perimeter, or at least a portion thereof, may be coated with an electrically conductive material. The electrically conductive portion of the outer perimeter is configured to be connected to a ground, such as a chassis ground. As an example, the substrate may be shaped to press fit into a cavity of a chassis of an electronic device proximate the first and/or second connector such that the electrically conductive portion of the outer perimeter contacts the chassis ground. Alternatively, the electrically conductive portion of the outer perimeter may be connected to the chassis ground in any other suitable manner. In another aspect, the entire outer perimeter may be electrically conductive.

Each of the connector pin holes has an interior edge, i.e., the inside surface of each pin hole. At least a portion of each of the interior edges is electrically conductive such that a respective connector pin of the first and/or second connector inserted into the respective connector pin hole is electrically connected to the electrically conductive portion of the interior edge of the respective pin hole.

For each of the connector pin holes, an electrically conductive trace is disposed on the first side of the substrate. Each of the traces has a first portion having a first sharp point which is electrically connected to the electrically conductive portion of the respective pin hole, and a second portion having a second sharp point electrically connected to the electrically conductive portion of the outer perimeter of the substrate. The second sharp point is spaced in close proximity to, and directed at, the first sharp point. The term "in close proximity" means spaced apart by a distance which provides a spark-over between the first and second sharp points at a predetermined spark-over voltage at a predetermined air pressure.

Alternatively, the second sharp point may be spaced apart from the first sharp point by a predefined distance, and directed at, the first sharp point. The predefined distance may be within a range from 0.20 mm to 0.60 mm, or from 0.30 mm to 0.50 mm, or from 0.35 mm to 0.45 mm, or a distance calculated to provide a spark-over at a desired spark-over voltage and/or at a specified air pressure. In still another alternative, the second sharp point may be spaced apart from the first sharp point by a minimum creepage distance for a specified peak working voltage as specified for the particular electrical circuit application. The minimum creepage distance is a minimum spacing between electrical components to maintain electrical isolation or separation of the components.

Each of sharp points creates a structure which provides a very high surface charge density for a given charge due to the very small area of the sharp points. As the charge density increases, the electric field increases. Accordingly, as static charge builds up at the sharp points, the electric field increases, and due to the high charge density at the sharp points, a spark-over will first occur at the sharp points, thereby discharging the electrostatic charge across the opposing sharp points and safely to the ground connected to the electrically conductive portion of the outer perimeter of the substrate. The non-contacting pairs of sharp points also maintain galvanic isolation of the separate electrical contacts on the first and second electrical connectors.

In another aspect of the ESD control device, the substrate and traces comprise a printed circuit board. In this way, the ESD control insert may be easily manufactured by using standard printed circuit board production techniques to form the sharp points and the respective connections to the electrically conductive portion of the respective pin hole and electrically conductive portion of the outer perimeter of the substrate.

In another aspect of the ESD control device, the connector pin holes may be arranged in a linear array to match the arrangement of the first and second connectors having electrical connections arranged in a linear array. In other words, the connector pin holes are arranged in a straight line.

In still another aspect of the ESD control device, the connector pin holes may be arranged in a two dimensional array to match the arrangement of the first and second connectors having electrical connections arranged in a two dimensional array.

In yet additional aspects, the connector pin holes may be arranged in a circular arrangement. The circular arrangement may be a single circular pattern at the same radius, or in a pattern of concentric circles. Again, the connector pin holes are arranged to match the arrangement of the electrical connections on the first and second connectors.

In fact, the connector pin holes may be arranged in any suitable pattern to match the arrangement of the electrical connections on the first and second connectors.

In still another feature of the ESD control device, the traces may be coated with a non-conductive protective coating, except for an area around each of the sharp point which is kept free from the protective coating, wherein the coating free area includes at least a pathway between each first sharp point and each respective second sharp point. For example, the protective coating may be a solder mask, or other suitable protective coating. Maintaining the sharp points free from protective coating ensures that the coating does not inhibit or otherwise alter the spark-over discharge characteristics of each of the pairs of first and second sharp points.

In still another aspect, each of the first and second sharp points may be plated with an electrically conductive plating to provide corrosion resistance. For example, each of the first and second sharp points may be plated with gold, silver, tin or lead-free solder.

Another embodiment of the present invention is directed a method of using the ESD control insert to provide ESD control for mating first and second connectors. The first connector has a plurality of connector pins and the second connector has a plurality of sockets or other suitable electrical contacts which electrically contact to a respective connector pin of the first connector when the first and second connector are connected to each other. The ESD control insert is installed onto the first connector such that each of the connector pins inserts into a respective connector pin hole and each connector pin is in electrical connection with the electrically conductive portion of the interior edge of the respective connector pin hole. In addition, the electrically conductive portion of the outer perimeter of the substrate is electrically connected to a chassis ground. The second connector is connected to the first connector such that each of the electrical contacts electrically contacts a respective connector pin and the electrostatic discharge control device is disposed between the first connector and the second connector.

In yet another embodiment, instead of sharp points, the ESD control insert may utilize one or more diodes (e.g., TVS diodes) in the place of each of the sharp points. The ESD control insert using diodes provides ESD control but does not provide galvanic isolation. Therefore, it may be used in a non-galvanic isolation application.

In still another embodiment, the ESD control insert may comprise capacitors in the place of each of the sharp points to provide electromagnetic interference (EMI) suppression.

BRIEF DESCRIPTION OF THE DRAWINGS

The foregoing and other aspects of embodiments are described in further detail with reference to the accompanying drawings, wherein like reference numerals refer to like elements and the description for like elements shall be applicable for all described embodiments wherever relevant.

DETAILED DESCRIPTION

Figure 1:
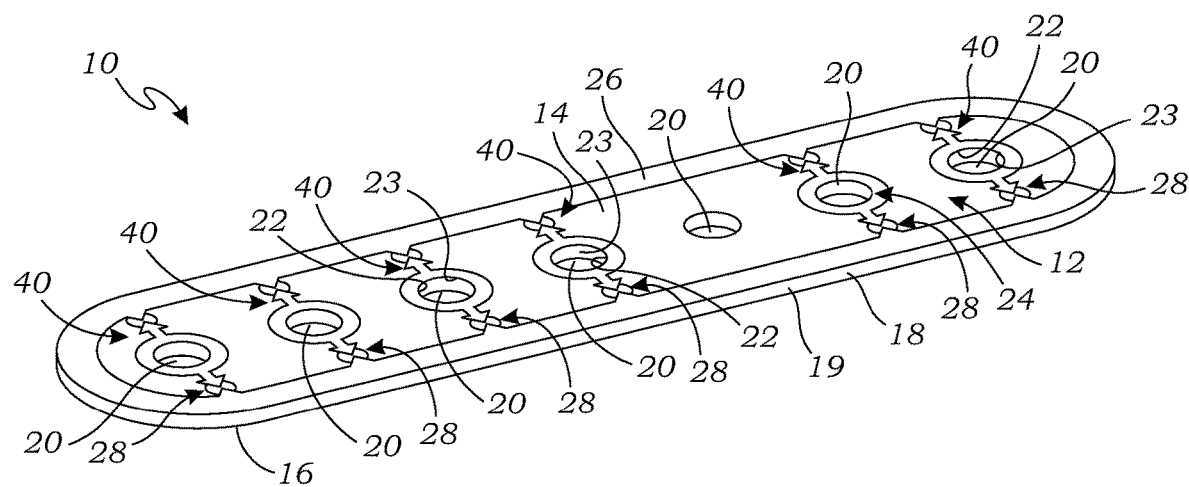
FIG. 1 is a perspective view of an electrostatic discharge (ESD) control insert, according to one embodiment of the present invention.

The present invention is directed to devices and methods for controlling electrostatic discharge (ESD) at the interface of mating electrical connectors. More specifically, the present invention is directed to an insert which can be installed between two mating connectors, a first connector 50 and a second connector 52 (see FIG. 3) to control electrostatic discharge from static charge the builds up on the electrical connectors 50, 52. The first connector a 50 has a plurality of connector pins 54, and the second connector 52 has a plurality of electrical contacts 56 (e.g., sockets or contact surfaces) which electrically contact a respective connector pin 54 when the first connector 50 and second connector 52 are connected to each other. As an example, the connector pins 54 may be pogo pins (i.e., spring-loaded pins which depress against the force of the springs), and the electrical contacts 56 may be surface contacts, as shown in FIG. 3.

Figure 3:
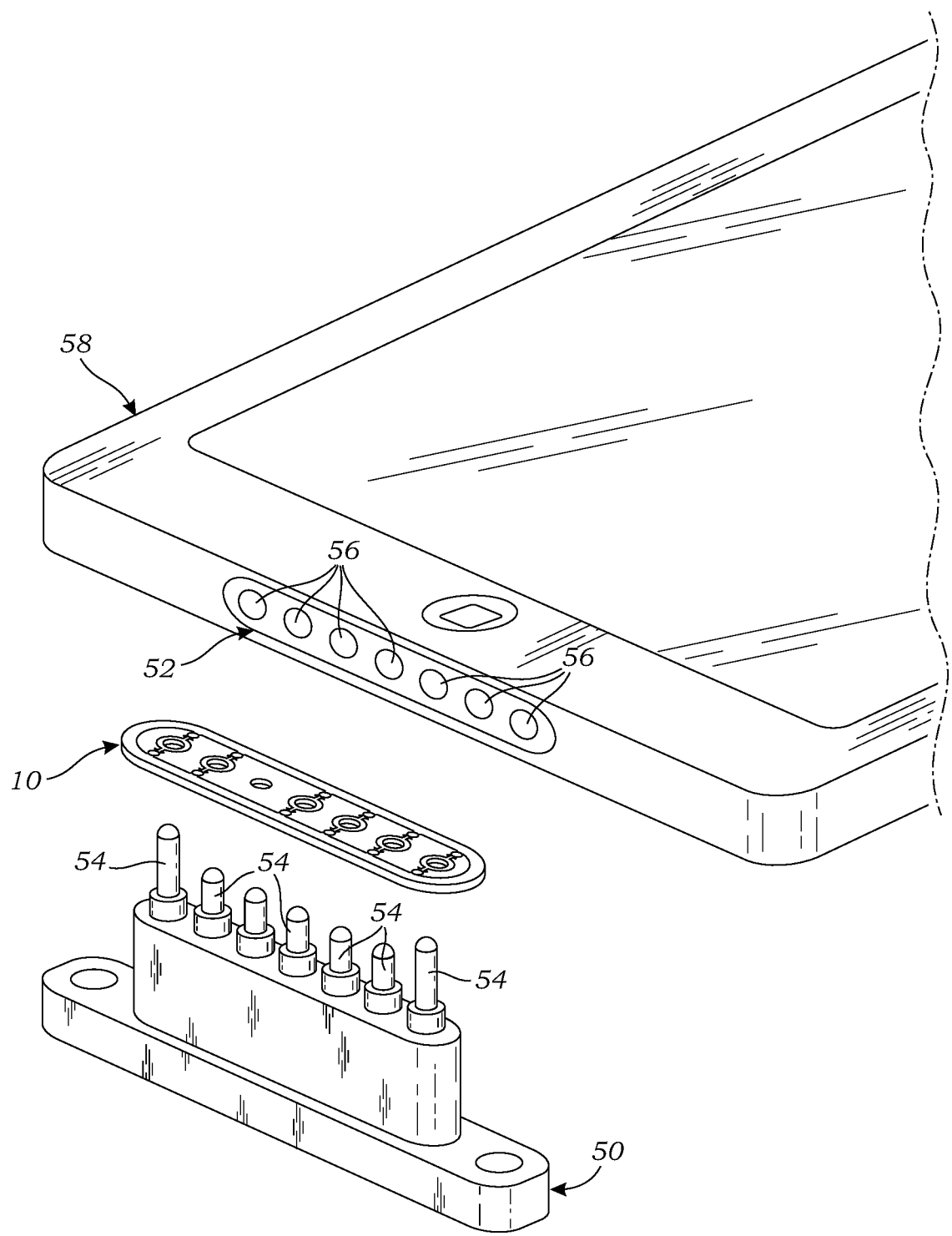
FIG. 3 is a perspective view of the ESD control insert of FIG. 1 being installed between a pair of mating connectors, according to one embodiment of the present invention.

In the example embodiment of FIG. 3, the first connector 50 may be mounted in a chassis of a docking base for a tablet computer 58. The second connector 52 is installed on a tablet computer 58 such that the second connector 52 mates to the first connector 50 when the tablet computer 58 is mounted on the docking base. For example, the docking base may be installed on an aircraft or other vehicle, and the tablet computer 58 may be a personal electronic device of the passenger or provided by the carrier for use by the passenger.

Figure 2:
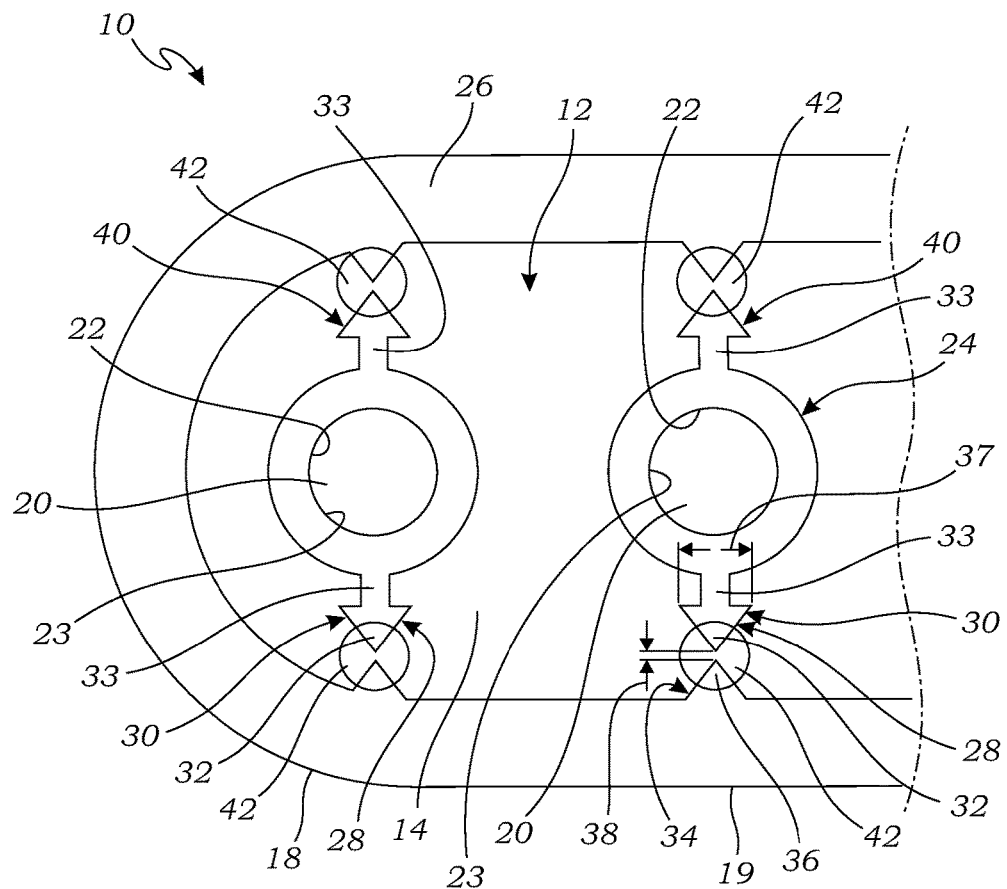
FIG. 2 is an enlarged, top view of a portion of the ESD control insert of FIG. 1, according to one embodiment of the present invention.

Referring to FIGS. 1-3, one embodiment of an ESD control insert 10 is shown. The insert 10 comprises a substrate 12 which is the base of the insert 10. The substrate 10 is a relatively thin plate which may be rigid, semi-rigid or flexible. The substrate may be formed from any suitable material, such as an electrically insulating or dielectric material. For example, the substrate may be made from any suitable printed circuit board material such as FR-4 to form a rigid substrate 10, or Kapton (flex-circuit material) to form a flexible substrate 10, or any other suitable material.

The substrate 12 has a first side 14, a second side 16 and an outer perimeter side/edge 18. As shown in FIG. 3, the substrate 12 is shaped to extend over all of the connector pins 54 and electrical contacts 56 of the first and second connectors 50, 52, respectively. The substrate 12 has a plurality of spaced apart connector pin holes 20. The connector pin holes 20 are arranged to positionally correspond to the connector pins 54 of the first connector 50 (see FIG. 3). In the exemplary embodiment of FIGS. 1-3, the connector pin holes 20, and corresponding connector pins 54, are arranged in a linear array. The substrate may also be shaped to fit within a recess or cavity proximate the first and/or second connectors in a particular use of the ESD control insert. The connector pin holes 20 are sized allow the connector pins 54 of the first connector 50 to be received into and extend through the connector pin holes 20.

The outer perimeter edge 18 of the substrate 12 is electrically conductive by coating the outer perimeter edge 18 with an electrically conductive material, such as copper, a copper alloy, silver, gold, or other suitable electrically conductive material, to form an outer perimeter edge conductor 19. In the illustrated embodiment of FIGS. 1-3, the entire outer perimeter edge 18 is electrically conductive by coating the entire perimeter edge 18 with the electrically conductive material. Alternatively, a portion of the outer perimeter edge 18 may be electrically conductive by coating just a portion of the outer perimeter edge 18. For example, just the semi-circular ends of the outer perimeter edge 18, or just the straight edges between the semi-circular ends may be electrically conductive. The outer perimeter edge conductor 19 is configured to be connected to a ground, such as a chassis ground, as described in further detail below.

Each of the connector pin holes 20 has an interior edge 22 formed by the inside surface of each pin hole 20. The interior edge 22 of each of the connector pin holes is electrically conductive by coating the interior edge 22 with an electrically conductive material, such as copper, a copper alloy, silver, gold, or other suitable electrically conductive material, to form an interior edge conductor 23. In the illustrated embodiment of FIGS. 1-3, the entire interior edge 22 is electrically conductive by coating the entire interior edge 22 with the electrically conductive material. Alternatively, a portion of the interior edge 22 may be electrically conductive by coating just a portion of the interior edge 18. In any case, the interior edge 22 conductor 23 is configured such that a respective connector pin 54 of the first connector 50 inserted into the respective connector pin hole 20 is electrically connected to the interior edge conductor 23 of the respective pin hole 20.

The electrically conductive coating disposed on the outer perimeter edge 18 and/or the interior edge 22 may be applied using printed circuit board production techniques, including additive and substractive lithographic processes.

An electrically conductive trace 24 is disposed on the first side 14 of the substrate 12. The trace 24 includes a number of electrically connected traces and electrically separated traces, which may be applied onto the first side 14 using printed circuit board production techniques, or other suitable process. The trace 24 includes a perimeter trace 26 around the perimeter of the first side 14. The perimeter trace 26 is electrically connected to the electrically conductive outer perimeter edge 18. The trace 24 also includes a respective first connector pin hole trace 28 for each of the connector pin holes 20. Each first connector pin hole trace 28 comprises a first portion 30 which is electrically connected to the interior edge conductor 23 of the respective pin hole 20. The first portion 30 includes a circular trace around the perimeter of the hole 20. The first portion 30 also has a first sharp point 32 directed toward the perimeter of the substrate 12. The first sharp points 32 in the embodiment of FIGS. 1-3 include a stem 33 to connect the sharp points 32 to the connect to the circular trace around each of the holes 20. The stem 33 is included to complete the connection between the first sharp point 32 and the interior edge conductor 23, and may be any suitable length to make the connection. In other configurations the first portion 30 may not include a stem 33, for example, when the first sharp point 32 directly connects to the circular trace around each of the holes 20 (see e.g., the embodiment of FIG. 4, in which the base of the sharp points 32 directly connect to the circular trace around each of the holes 20.

Each first connector pin hole trace 28 also comprises a second portion 34 which is electrically connected to the outer perimeter edge conductor 19. The second portion 34 also has a second sharp point 36 which is spaced in close proximity to, and directed at, the first sharp point 32. The term "in close proximity" means spaced apart by a distance 38 which provides a spark-over between the first sharp point 32 and second sharp point 36 at a predetermined spark-over voltage at a predetermined air pressure.

Figures 4, 5:
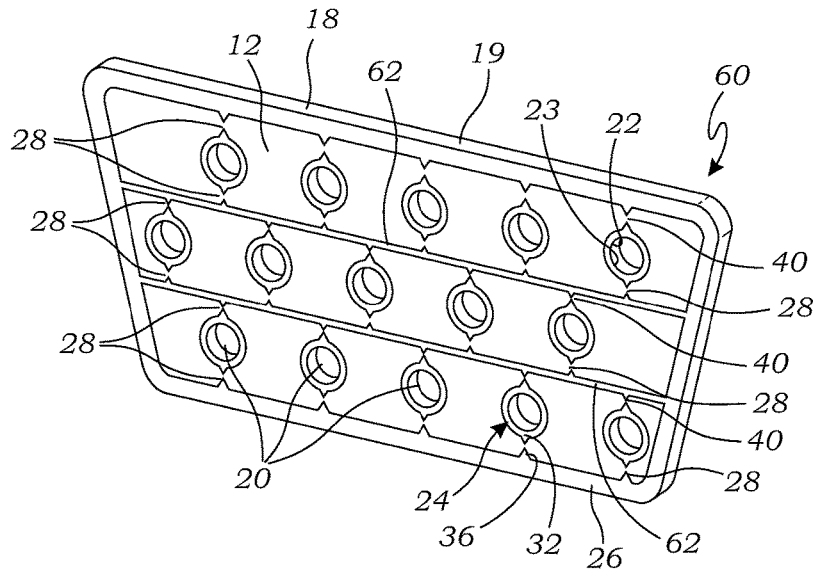
FIG. 4 is a perspective view of an ESD control insert, according to another embodiment of the present invention.
FIG. 5 is a table showing exemplary minimum creepage distance for circuits other than primary AC circuits, according to one embodiment of the present invention.

Alternatively, the second sharp point 36 may be spaced apart from the first sharp point 32 by a predefined distance, and directed at, the first sharp point. The predefined distance may be within a range from 0.20 mm to 0.60 mm, or from 0.30 mm to 0.50 mm, or from 0.35 mm to 0.45 mm, or a distance calculated to provide a spark-over at a desired spark-over voltage and/or at a specified air pressure. In still another alternative, the second sharp point 36 may be spaced apart from the first sharp point 32 by a minimum creepage distance for a specified peak working voltage as specified for the particular electrical circuit application. The minimum creepage distance is a minimum spacing between electrical components to maintain electrical isolation or separation of the components. For instance, FIG. 5 is a table showing exemplary minimum creepage distance for circuits other than primary AC circuits. The table shows that for a working voltage of 10 volts for an external circuit (i.e., on an external layer of a PCB), the minimum creepage distance is 0.40 mm, and therefore, in such an application, the second sharp point 36 should be spaced apart from the first sharp point 32 by 0.40 mm.

Optionally, the trace 24 may also include a respective second connector pin hole trace 40 for each of the connector pin holes 20. Each second connector pin hole trace 40 is basically the same as the first connector pin hole trace 28 except it is located on the opposite side of the respective pin hole 20 from the first connector pin hole trace 28.

The first sharp points 32 and second sharp points 36 may be triangular shaped traces having a sharp point. Alternatively, the first sharp points 32 and second sharp points 36 may have any other suitable shape, such as a diamond shape, rectangular shape, other polygonal shape, etc., having a sharp point. The sharp points may a width of less than 50 µm, or less than 100 µm, or less than 200 µm. Each of the first sharp points 32 and second sharp points 36 may be plated with an electrically conductive plating to provide corrosion resistance, such as plating with gold, silver, tin, lead-free solder, or other corrosion resistant, electrically conductive plating.

The trace 24, or any suitable portion thereof, may be coated with a non-conductive protective coating, except for a non-coated area 42 around each of the sharp points 32, 36. The protective coating may be any suitable coating, such as solder mask or other coating, such as coating commonly utilized on PCBs. The non-coated area 42 includes a pathway between each first sharp point 32 and each respective second sharp point 36. The non-coated area 42 includes an area having a largest width which is less than the twice the largest width 37 of the respective first connector pin hole trace 28 around the respective sharp points 32, 36 and includes at least a pathway between each first sharp point 32 and each respective second sharp point 36. The non-coated area ensures that the coating does not inhibit or otherwise alter the spark-over discharge characteristics of each of the pairs of first and second sharp points 32, 36.

Accordingly, the ESD control insert 10 provides a device for discharging static charge which builds up on the mating first and second connectors 56. Each of first and second sharp points 32, 36 creates a structure which provides a very high surface charge density for a given charge due to the very small area of the sharp points. As the charge density increases, the electric field increases. Accordingly, as static charge builds up at the sharp points 32, 36, the electric field increases, and due to the high charge density at the sharp points 32, 36, a spark-over will first occur at the sharp points 32, 36, thereby discharging the electrostatic charge across the opposing sharp points 32, 36 and safely to a ground connected to the outer perimeter edge conductor 19. The non-contacting pairs of sharp points 32, 36 also maintain galvanic isolation of the separate electrical contacts 54, 56 on the first and second electrical connectors 52, 54.

Referring to FIG. 3, a method of using the ESD control insert 10 with mating first and second connectors 50, 52, is illustrated. The ESD control insert 10 is installed onto the first connector 50 such that each of the connector pins 54 inserts into a respective connector pin hole 20 and each connector pin 54 is in electrical connection with the interior edge conductor 23 of the respective connector pin hole 20. The ESD control insert 10 may be installed with the first side 14 facing and bearing against the first connector 50, or with second side 16 facing and bearing against the first connector 50. In other words, the ESD control insert 10 may be installed facing either direction, and. In the case that the ESD control insert 10 has a symmetrical design with respect to the connector pin holes 20, the ESD control insert 10 may also be installed upside down or left to right, interchangeably (i.e., the ESD control insert 10 may be rotated 180°). The outer perimeter edge conductor 19 of the substrate 12 is electrically connected to a chassis ground. For example, the substrate 12 may be press fit, or interference fit, into a recess in a chassis to which the first connector 50 is mounted, such that the outer perimeter edge conductor 19 is grounded to the chassis. The second connector 52 is connected to the first connector 50 such that the respective pins 54 electrically contact a respective contact 56 and the ESD control insert 10 is disposed between the first connector 50 and the second connector 52.

Turning to FIG. 4, another embodiment of an ESD control device 60 is illustrated. The ESD control device 60 is substantially the same as the ESD control device 10, except that the ESD control device 60 is for use with mating connectors having electrical contacts arranged in a two-dimensional array. Accordingly, the description for the each of the elements of the ESD control device 10, and the method of using the ESD device 10, is applicable to the ESD device 60. The trace 24 of the ESD control device 60 includes connecting traces 62 extending longitudinally between the rows of connector pin holes 20 in order to connect the first and/or second connector pin traces 28, 40 to the outer perimeter edge conductor 19.

In yet another embodiment, instead of sharp points, the ESD control insert may utilize one or more diodes (e.g., TVS diodes) in the place of each of the sharp points. The ESD control insert using diodes provides ESD control but does not provide galvanic isolation. Therefore, it may be used in a non-galvanic isolation application.

In still another embodiment, the ESD control insert may comprise capacitors in the place of each of the sharp points to provide electromagnetic interference (EMI) suppression.

Although particular embodiments have been shown and described, it is to be understood that the above description is not intended to limit the scope of these embodiments. While embodiments and variations of the many aspects of the invention have been disclosed and described herein, such disclosure is provided for purposes of explanation and illustration only. Thus, various changes and modifications may be made without departing from the scope of the claims. For example, not all of the components described in the embodiments are necessary, and the invention may include any suitable combinations of the described components, and the general shapes and relative sizes of the components of the invention may be modified. Accordingly, embodiments are intended to exemplify alternatives, modifications, and equivalents that may fall within the scope of the claims. The invention, therefore, should not be limited, except to the following claims, and their equivalents.

What is claimed is:

1. An electrostatic discharge control device, comprising:
   a substrate having an outer perimeter, a first side, and at least one connector pin hole, the substrate being made of a material selected from a group consisting of a dielectric material and a non-conductive material;
   at least a portion of the outer perimeter of the substrate being electrically conductive;
   each of the connector pin holes having an interior edge, at least a portion of each respective interior edge being electrically conductive; and for each of the connector pin holes, an electrically conductive trace disposed on the first side of the substrate, each respective trace having a first portion electrically connected to the electrically conductive portion of the respective pin hole and having a first sharp point, and a second portion electrically connected to the electrically conductive portion of the outer perimeter of the substrate and having a second sharp point in close proximity to, and directed at, the first sharp point, wherein each trace is coated with a protective coating except that a respective area around each sharp point is free from the protective coating, each respective area having a largest width which is less than twice the largest width of a respective trace around each sharp point and includes at least a pathway between each first sharp point and each respective second sharp point.

2. The electrostatic discharge control device of claim 1, wherein the substrate and trace comprise a printed circuit board.

3. The electrostatic discharge control device of claim 2, wherein the entire outer perimeter edge is coated with a second electrically conductive coating.

4. The electrostatic discharge control device of claim 1, wherein the at least one connector pin hole comprises a plurality of connector pin holes arranged in a linear array.

5. The electrostatic discharge control device of claim 1, wherein the at least one connector pin hole comprises a plurality of connector pin holes in arranged in a two dimensional array.

6. The electrostatic discharge control device of claim 1, wherein the entire interior edge of each of the connector pin hole(s) is coated with a first electrically conductive coating.

7. The electrostatic discharge control device of claim 6, wherein the entire outer perimeter edge is coated with a second electrically conductive coating.

8. The electrostatic discharge control device of claim 1, wherein the entire outer perimeter edge is coated with a second electrically conductive coating.

9. A method of using an electrostatic discharge control device, comprising:
providing an electrostatic discharge device comprising:
a substrate having an outer perimeter, a first side, and a plurality of connector pin holes, the substrate being made of a material selected from a group consisting of a dielectric material and a non-conductive material;
at least a portion of the outer perimeter of the substrate being electrically conductive;
each of the connector pin holes having an interior edge, at least a portion of each respective interior edge being electrically conductive;
for each of the connector pin holes, an electrically conductive trace disposed on the first side of the substrate, each respective trace having a first portion electrically connected to the electrically conductive portion of the respective pin hole and having a first sharp point, and a second portion electrically connected to the electrically conductive portion of the outer perimeter of the substrate and having a second sharp point in close proximity to, and directed at, the first sharp point,
wherein the electrically conductive trace is coated with a protective coating except that an area having a largest width which is less than twice the largest width of the trace around each sharp point and includes at least a tip of a sharp point is free of the protective coating;
installing the electrostatic discharge control device onto a first connector having a plurality of connector pins such that: (a) each of the connector pins inserts into a respective connector pin hole and is in electrical connection with the electrically conductive portion of the interior edge of the respective connector pin hole; and
(b) the electrically conductive portion of the outer perimeter of the substrate is electrically connected to a chassis ground; and
installing a second connector onto the first connector, the second connector having a plurality of electrical contacts each configured to contact a respective connector pin when the second connector is installed onto the first connector, wherein the electrostatic discharge control device is disposed between the first connector and the second connector.

10. The method of claim 9, wherein the electrostatic discharge device is installed onto the first connector before the first connector is installed onto the second connector.

11. The method of claim 9, wherein the electrostatic discharge device is installed onto the second connector before the electrostatic discharged device is installed onto the first connector.

12. The method of claim 9, wherein the substrate and trace comprise a printed circuit board.

13. The method of claim 9, wherein the plurality of connector pin holes and the plurality of connector pins are respectively arranged in a linear array.

14. The method of claim 9, wherein the plurality of connector pin holes and the plurality of connector pins are respectively in arranged in a two dimensional array.

15. An electrostatic discharge control device, comprising:
a substrate having an outer perimeter edge, a first side, and at least one connector pin hole, the substrate being made of a material selected from a group consisting of a dielectric material and a non-conductive material;
at least a portion of the outer perimeter edge of the substrate coated with a first electrically conductive coating;
each of the connector pin holes having an interior edge, each respective interior edge at least partially coated with a second electrically conductive coating configured to contact a connector pin inserted into the respective connector pin hole; and
for each of the connector pin holes, an electrically conductive trace disposed on the first side of the substrate, each respective trace having a first portion electrically connected to the first electrically conductive coating and having a first sharp point, and a second portion electrically connected to the second electrically conductive coating and having a second sharp point spaced apart from the other sharp point by a predefined distance, and directed at, the first sharp point,
wherein each trace is coated with a protective coating except that a respective area around each sharp point is free from the protective coating, each respective area having a largest width which is less than twice the largest width of a respective trace around each sharp point and includes at least a pathway between each first sharp point and each respective second sharp point.

16. The electrostatic discharge control device of claim 15, wherein the substrate and traces comprise a printed circuit board.

17. The electrostatic discharge control device of claim 15, wherein the at least one connector pin hole comprises a plurality of connector pin holes arranged in one of a linear array and a two dimensional array.

18. The electrostatic discharge control device of claim 15, wherein the predefined distance is in a range from 0.20 mm to 0.60 mm.

* * * * *